United States Patent
Matsumoto et al.

(10) Patent No.: US 10,247,620 B2
(45) Date of Patent: Apr. 2, 2019

(54) WIRING BOARD AND TEMPERATURE SENSING ELEMENT

(71) Applicant: KYOCERA Corporation, Kyoto-shi, Kyoto (JP)

(72) Inventors: Hiroshi Matsumoto, Kyoto (JP); Kengo Morioka, Kyoto (JP); Takahito Hirata, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 211 days.

(21) Appl. No.: 15/303,915

(22) PCT Filed: Apr. 20, 2015

(86) PCT No.: PCT/JP2015/061973
§ 371 (c)(1),
(2) Date: Oct. 13, 2016

(87) PCT Pub. No.: WO2015/163278
PCT Pub. Date: Oct. 29, 2015

(65) Prior Publication Data
US 2017/0219439 A1 Aug. 3, 2017

(30) Foreign Application Priority Data

Apr. 21, 2014 (JP) .................. 2014-087416
Jun. 19, 2014 (JP) .................. 2014-126423
Sep. 22, 2014 (JP) .................. 2014-192676

(51) Int. Cl.
*G01K 7/18* (2006.01)
*G01K 7/20* (2006.01)
(Continued)

(52) U.S. Cl.
CPC .............. *G01K 7/18* (2013.01); *G01K 7/20* (2013.01); *H05K 1/0306* (2013.01); *H05K 1/09* (2013.01); *H05K 2201/10151* (2013.01)

(58) Field of Classification Search
CPC .. H01C 7/021; H01C 1/021; G01K 7/18–7/20
See application file for complete search history.

(56) References Cited

U.S. PATENT DOCUMENTS 4,375,056 A * 2/1983 Baxter .................. G01K 7/183
338/195
6,140,906 A * 10/2000 Kaihara ................. G01K 7/183
29/610.1
(Continued)

FOREIGN PATENT DOCUMENTS

JP            11-121214 A      4/1999

*Primary Examiner* — Clayton E. LaBalle
*Assistant Examiner* — Leon W Rhodes, Jr.
(74) *Attorney, Agent, or Firm* — Volpe and Koenig, P.C.

(57) ABSTRACT

A wiring board includes an insulating substrate composed of a stack of a plurality of insulating layers, the insulating substrate having an upper face, a lower face, and side faces; and a plurality of line conductors formed of platinum or a metallic material comprising platinum as a main component, the plurality of line conductors each including a first end and a second end located on a side opposite to the first end, the plurality of line conductors being respectively disposed in interlayers between the plurality of insulating layers, in the line conductors, a line width of a line conductor located in an interlayer among the interlayers which interlayer is closest to the upper face or the lower face of the insulating substrate being greater than a line width of a line conductor located in each of the other interlayers.

23 Claims, 9 Drawing Sheets

(51) Int. Cl.
*H05K 1/03* (2006.01)
*H05K 1/09* (2006.01)

(56) References Cited

U.S. PATENT DOCUMENTS

| | | | |
|---|---|---|---|
| 6,653,926 B1 * | 11/2003 | Zitzmann | G01K 7/18 338/25 |
| 7,746,212 B2 * | 6/2010 | Zitzmann | G01K 7/186 338/22 R |
| 8,169,046 B2 * | 5/2012 | Chen | G01K 7/183 257/467 |

* cited by examiner

WIRING BOARD AND TEMPERATURE SENSING ELEMENT

TECHNICAL FIELD

The present invention relates to: a wiring board in which line conductors formed of platinum or the like are disposed between a plurality of insulating layers stacked on one another; and a temperature sensing element including the wiring board.

BACKGROUND ART

As a sensor for temperature detection in a fluid such as exhaust gas having a high temperature (e.g., about hundreds to 1000° C.), a sensor is known that utilizes a temperature-dependent change in the electric resistance value of a metallic material. As the metallic material, from the perspectives of oxidation resistance, temperature dependence of the electric resistance value, and the like at high temperatures, a metallic material containing platinum is employed in many cases.

As a component part constituting a sensor containing a metallic material for temperature measurement, for example, there is known a wiring board in which linear conductors each composed of a metallized layer or a thin film layer of platinum or the like are disposed in interlayers of a plurality of insulating layers which are each composed of a ceramic sintered body or the like and are stacked on one another.

CITATION LIST

Patent Literature

Patent Literature 1: Japanese Unexamined Patent Publication JP-A H11-121214 (1999)

SUMMARY OF INVENTION

Technical Problem

Nevertheless, the above-mentioned wiring board or the like of the related art has a problem that a change in the electric resistance value of the line conductors is caused by a factor other than the temperature in some cases. When such a change occurs in the electric resistance value, for example, a change is caused in the reference electric resistance value at a temperature (such as a so-called ordinary temperature of about 25° C.) adopted as a reference so that the detection accuracy for the temperature is degraded.

Solution to Problem

As a result of investigation of the above-mentioned problem, the inventors have found that such a change in the electric resistance value is caused by a fact that a part of the platinum or the like forming the line conductors escapes (e.g., sublimates) through the inside of the insulating substrate to the outside. By virtue of this, the invention has been arrived at.

That is, a wiring board according to an embodiment of the invention includes: an insulating substrate composed of a stack of a plurality of insulating layers, the insulating substrate having an upper face, a lower face, and side faces; and a plurality of line conductors formed of platinum or a metallic material comprising platinum as a main component, the plurality of line conductors each including a first end and a second end located on a side opposite to the first end, the plurality of line conductors being respectively disposed in interaleyrs between the plurality of insulating layers, in the line conductors, a line width of a line conductor located in an interlayer among the interlayers which interlayer is closest to the upper face or the lower face of the insulating substrate being greater than a line width of a line conductor located in each of the other interlayers.

A wiring board according to another embodiment of the invention includes: an insulating substrate composed of a stack of a plurality of insulating layers, the insulating substrate having an upper face, a lower face, and side faces; and a line conductor formed of platinum or a metallic material comprising platinum as a main component, the line conductor including a first end and a second end located on a side opposite to the first end, the line conductor being disposed between the plurality of insulating layers in a pattern including at least one folded portion which faces a side face of the insulating substrate line widths of the at least one folded portion and a portion of the line conductor which faces the side face of the insulating substrate being greater than line widths of the other portions of the line conductor.

Further, a temperature sensing element according to an embodiment of the invention includes: the wiring board configured mentioned above; and terminals for temperature measurement electrically connected to the line conductor of the wiring board.

Advantageous Effects of Invention

The wiring board according to the above-mentioned embodiment of the invention has the above-mentioned configuration. Thus, the amount of platinum or the like is relatively high in the line conductor located in an interlayer closest to the upper face or the lower face of the insulating substrate where sublimation or the like of the platinum or the like to the outside air occurs most easily among the line conductors. Thus, even when a part of the platinum or the like has escaped to the outside (sublimation or the like has occurred), the fraction (the relative amount) of reduction of the line conductor in the interlayer is suppressed relatively small. Thus, the fraction of change (increase) in the electric resistance value of the line conductor is suppressed relatively small. Accordingly, it is possible to provide a wiring board in which the detection accuracy for the temperature change based on a change in the electric resistance value is high and further the accuracy can be maintained over a long term.

The wiring board according to the another embodiment of the invention has the above-mentioned configuration. Thus, the amount of platinum or the like is relatively high in a portion of the line conductor which faces a side face of the insulating substrate where sublimation or the like of the platinum or the like to the outside air occurs most easily within the line conductor. Thus, even when a part of the platinum or the like has escaped to the outside (sublimation or the like has occurred), the fraction (the relative amount) of reduction of the line conductor in that portion is suppressed relatively small. Thus, the fraction of change (increase) in the electric resistance value of the line conductor is suppressed relatively small. Accordingly, it is possible to provide a wiring board in which the detection accuracy for the temperature change based on a change in the electric resistance value is high and further the accuracy can be maintained over a long term.

According to the temperature sensing element of the above-mentioned embodiment of the invention, since the wiring board having the above-mentioned configuration is employed, it is possible to provide a temperature sensing element having high detection accuracy for a temperature change.

DESCRIPTION OF EMBODIMENTS

The wiring board and the temperature sensing element according to embodiments of the invention are described below with reference to the accompanying drawings. Here, distinction of up and down in the following description is merely for convenience and this does not limit the actual up and down directions in the usage of the wiring board or the like.

First Embodiment

Figure 1:
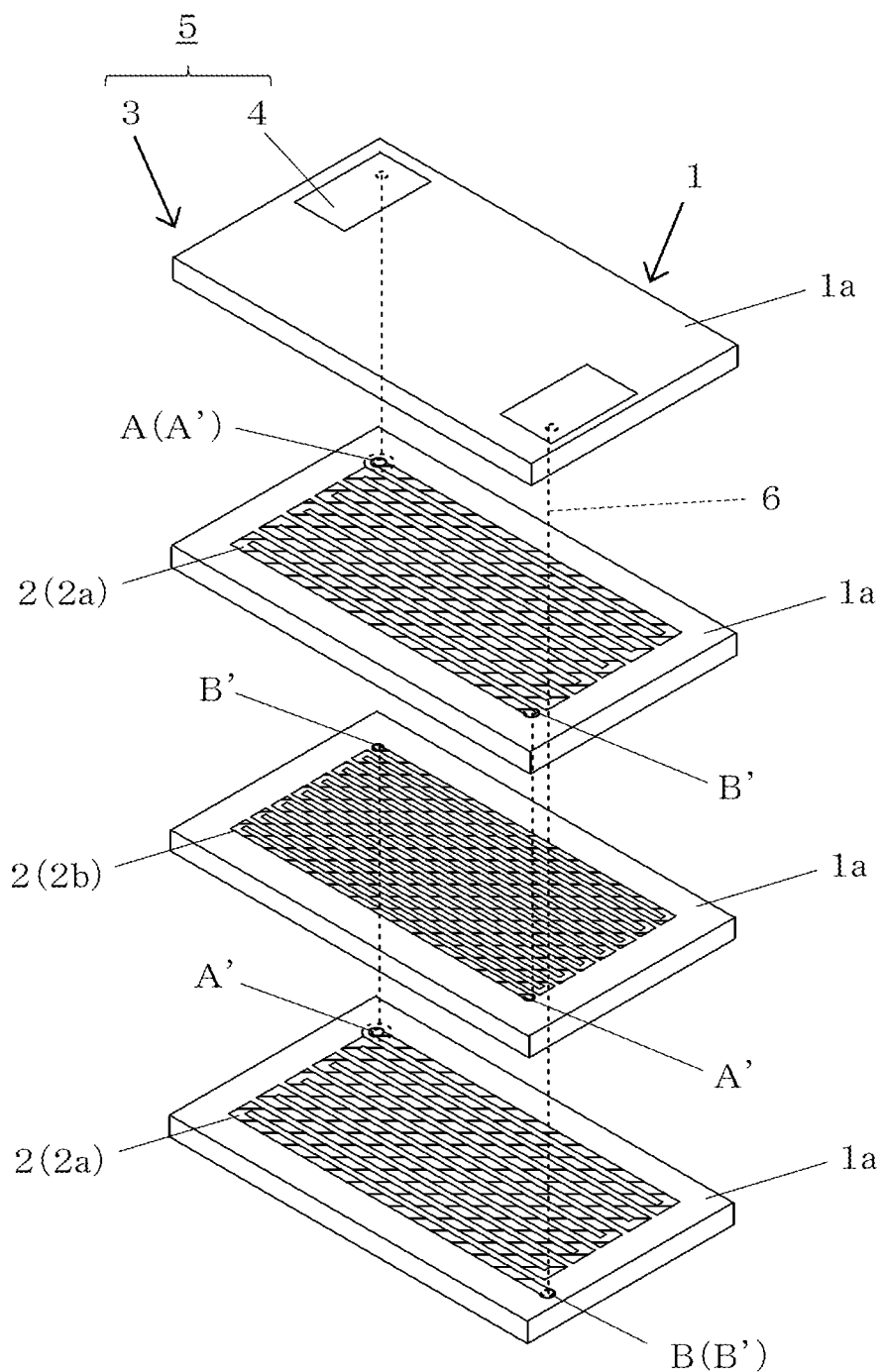
FIG. 1 is an exploded perspective view showing a wiring board and a temperature sensing element according to a first embodiment of the invention.

FIG. 1 is an exploded perspective view showing a wiring board and a temperature sensing element according to a first embodiment of the invention. FIGS. 2(a) to 2(c) are plan views each showing each insulating layer of the wiring board and the temperature sensing element shown in FIG. 1.

Figure 2:
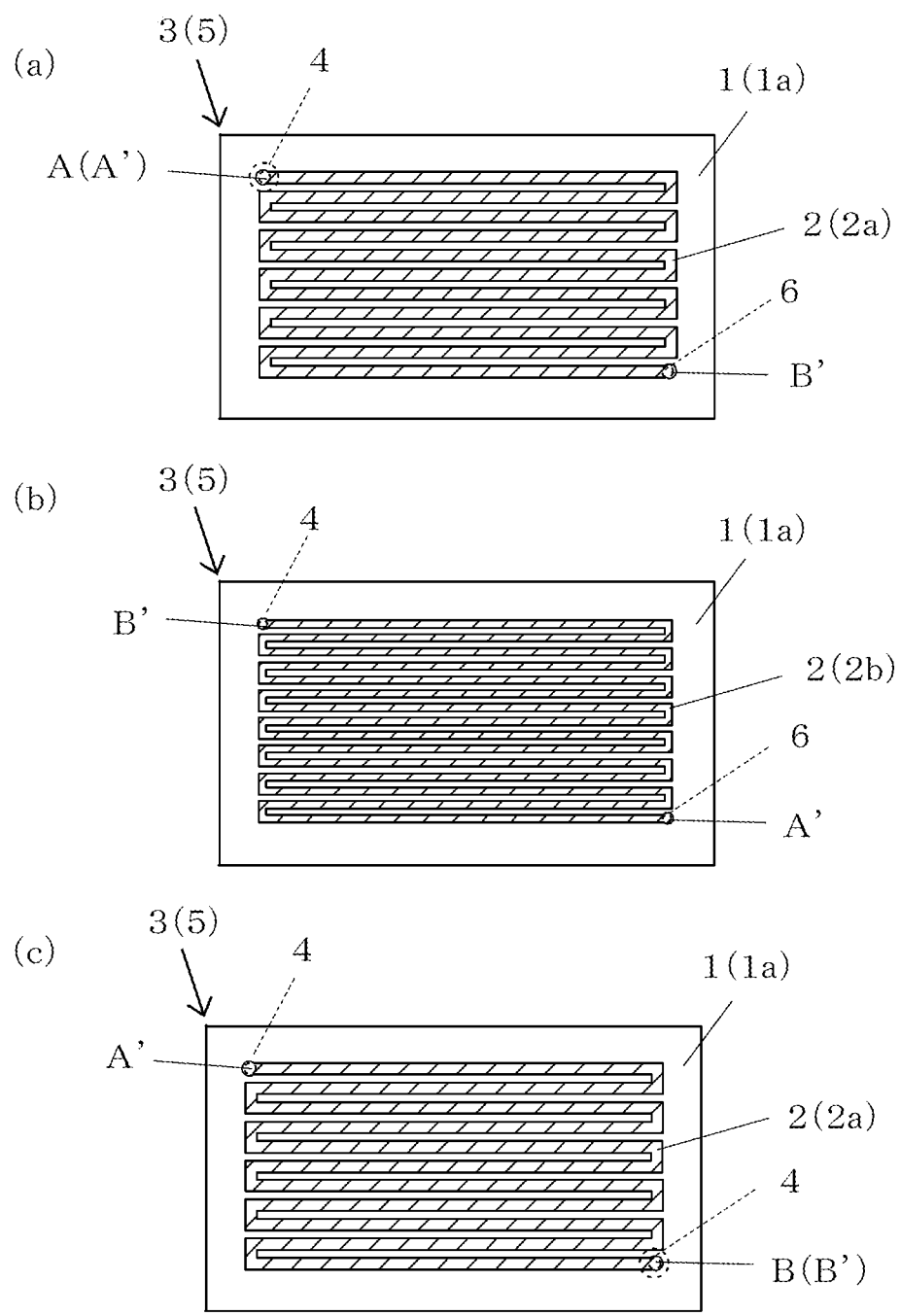
FIGS. 2(a) to 2(c) are plan views each showing each insulating layer of the wiring board and the temperature sensing element shown in FIG. 1.

As shown in FIGS. 1 and 2, a line conductor 2 is disposed in an insulating substrate 1 composed of a stack of a plurality of insulating layers 1a, so that a wiring board 3 is basically formed. Further, terminals 4 are disposed on the wiring board 3 so that a temperature sensing element 5 is basically formed. FIG. 2 shows the line conductor 2 seen through the insulating layers 1a in a situation where the wiring board 3 and the temperature sensing element 5 are viewed from above. Temperature measurement is achieved by utilizing a fact that the electric resistance of the line conductor 2 varies depending on the temperature. That is, on the basis of a measured value of the electric resistance of the line conductor 2, a temperature of the environment where the wiring board 3 and the like are located is calculated and detected.

For example, the insulating substrate 1 has a flat plate shape such as a quadrangular plate shape and serves as a substrate part where the line conductor 2 is to be disposed. The insulating substrate 1 in the first embodiment includes an upper face, a lower face, and four side faces each of which has a quadrangular shape. The upper face and the lower face are in parallel to each other and at right angles to the four side faces (the angle formed between the upper face or the lower face and each side face is approximately 90 degrees). In other words, the insulating substrate 1 has a rectangular parallelepiped shape. However, employable shapes for the insulating substrate 1 are not limited to the rectangular parallelepiped shape and may be other shapes such as a shape having a depression or a protrusion in the outer face, or a disk shape.

For example, the insulating substrate 1 is composed of a ceramic sintered body such as an aluminum-oxide based sintered body, an aluminum-nitride based sintered body, a mullite-based sintered body, and a glass-ceramic sintered body. The insulating substrate 1 is composed of a stack of the plurality of insulating layers 1a (four insulating layers 1a in the example shown in FIGS. 1 and 2) which are each composed of a ceramic sintered body described above.

For example, in a case where each insulating layer 1a is to be composed of an aluminum-oxide based sintered body, the insulating substrate 1 can be produced by the following method. First, slurry is prepared by adding and mixing an organic binder, a solvent, and the like selected suitably to raw material powder of aluminum oxide, silicon oxide, magnesium oxide, calcium oxide, or the like. Then, the slurry is formed into a sheet shape by a doctor blade method or the like so that ceramic green sheets are prepared. Then, these ceramic green sheets are cut into suitable dimensions and then a plurality of these sheets are stacked on one another so that a stack is produced. After that, the stack is fired at a high temperature (approximately 1300° C. to 1600° C.) so that the insulating substrate 1 can be produced. The plurality of ceramic green sheets respectively constitute the insulating layers 1a. Here, the insulating substrate 1 may contain glass. Further, the insulating substrate 1 may include an insulating layer composed mainly of glass.

The line conductor 2 is formed of platinum or a metallic material comprising platinum which is a metallic material whose electric resistance varies depending on the temperature, as a main component. For the purpose of detecting a temperature-dependent change in the electric resistance of a metallic material caused by a temperature change, it is preferable that the absolute value of the electric resistance of the line conductor in the initial stage (in a state of a so-called ordinary temperature of about 25° C.) is greater.

The reason of this is as follows. That is, the change in the electric resistance value caused by a temperature change of the line conductor 2 occurs in a fixed ratio regardless of the magnitude (the absolute value) of the initial electric resistance value. That is, when the initial electric resistance value becomes higher, the absolute value of the change in the electric resistance caused by the temperature change becomes greater. When the absolute value of the change in the electric resistance becomes greater, a noise (a fluctuation in the electric resistance caused by a factor other than the temperature change) becomes harder to affect the result. Further, the measurement also becomes easier. Thus, it is preferable that the line conductor 2 has a higher initial electric resistance value. Thus, the metallic material of platinum or the like is formed in a line shape (that is, a shape in which the length of the interval used for measuring the electric resistance value is long and hence this has an advantage in ensuring a greater absolute value of the electric resistance).

As for components other than platinum in the metallic material comprising platinum as a main component, components (kinds) and amounts to be added are suitably selected for the purpose of adjustment of the temperature coefficient of resistance (TCR) of the line conductor 2, improvement of the heat resistance, or the like. For example, employable components other than platinum include: a metallic material of platinum group element such as palladium, rhodium, and iridium; and gold. Here, for example, in a case where the linearity in the change in the electric resistance value caused by a temperature change of the line conductor 2 is regarded as important, a higher platinum content is preferable.

The metallic material comprising platinum as a main component contains platinum at a fraction of approximately 80 mass % or higher. The platinum and the other components may form an alloy or, alternatively, may be present in the form of crystal grains independent of each other. Here, the line conductor 2 may contain an additive material other than a metallic component such as platinum and a metallic material comprising platinum as a main component. For example, employable additive materials include inorganic particles of aluminum oxide or the like similar to those contained in the insulating substrate 1. For example, such an additive material is added for the purpose of matching of the firing shrinkage rate or the like between the line conductor 2 and the insulating layer 1a.

For example, the line conductor 2 can be formed by preparing metal paste by kneading powder of platinum together with an organic solvent and a binder; then, applying the obtained metal paste to the principal surface or the like of each ceramic green sheet for constituting the insulating layer 1a in a predetermined pattern; and then performing co-firing.

The electric resistance value between one end (a first end A) of the line conductor 2 and an end (a second end B) on the opposite side is measured by an external electric circuit (not shown) or the like. The electric resistance value varies depending on the temperature of the line conductor 2 and the temperature of the line conductor 2 varies depending on the temperature (the external temperature) of the environment where the wiring board 3 and the like are located. That is, when the electric resistance value between the first end A and the second end B of the line conductor 2 is detected, the external temperature is detected.

For example, the external temperature is the temperature of various combustion exhaust gases. Thus, a high temperature of about hundreds to 1000° C. need be detected in some cases. Because of satisfactory stability at such a high temperature and of satisfactory linearity in the change in the electric resistance value depending on the temperature, the line conductor 2 is formed of platinum or a metallic material comprising platinum as a main component. For example, the temperature sensing element 5 is mounted on an external board (not shown) provided with the above-mentioned electric circuit (an external electric circuit) for resistance detection and then installed together with such an external board and the like in a portion where an object whose temperature is to be measured is present (flow passage of the gas and the like).

Further, when the line conductor 2 is in a state of being exposed to the outside air, there is a possibility that an undesired change is caused in the electric resistance value due to adhesion of a foreign matter or, breakage or the like caused by accidental contact with an external board (not shown) or with any other component part mounted on the external board. In order to prevent such a situation, the line conductor 2 is respectively disposed in interlayers between the plurality of insulating layers 1a. In other words, the line conductor 2 is disposed in the inside of the insulating substrate 1 and hence not exposed to the outside.

In the wiring board 3 of the first embodiment, the insulating substrate 1 includes four insulating layers 1a and hence includes three interlayers between the insulating layers 1a. The line conductor 2 is disposed in each of the three interlayers. In other words, three insulating layers 1a in each of which the line conductor 2 is disposed on the principal surface (the upper face) thereof and another insulating layer 1a in which the line conductor 2 is not provided are successively stacked on one another. The uppermost line conductor 2 (2a) is covered by the another insulating layer 1a described above and hence is located in the inside of the insulating substrate 1.

By virtue of this, in a state where the area of the wiring board 3 in a plan view thereof is suppressed as small as possible, the length of the line conductor 2 can be increased, that is, the initial electric resistance value between the first end A and the second end B of the line conductor 2 can be increased as high as possible. Thus, this configuration is more advantageous in size reduction of the wiring board 3 and the temperature sensing element 5 and in reduction of the influence of a noise.

Here, the line conductor 2 (2a) located in the upper interlayer or the lower interlayer has a line width greater than the line width of the line conductor 2 (2b) located in the middle interlayer. Details of this are described later.

Further, in the present example, the configuration may be recognized such that the three line conductors 2 (2a, 2b) disposed in the three interlayers form a single and continuous line conductor (no reference sign). For example, the second end B' of the line conductor 2 (2a, 2b) in the upper interlayer is successively connected electrically through a penetration conductor (not shown) to the first end A' of the line conductor (2b, 2a) in the lower interlayer. By virtue of this, the line conductors 2 (2a, 2b) in the three interlayers are successively connected so that a single and continuous line conductor 2 is formed. The first end A of the entirety of the single and continuous line conductor 2 is located in the upper interlayer and the second end B is located in the lower interlayer. Then, these ends are connected electrically through penetration conductors 6 to the terminals 4, respectively, on the upper face of the insulating substrate 1.

Further, in the line conductor 2, as described above, the line width in an interlayer closest to the upper face of the insulating substrate 1 or in an interlayer closest to the lower face (in the upper or the lower interlayer) is greater than the line width in the other interlayer (the middle interlayer). That is, within the line conductor 2, the amount of platinum or the like is relatively high in the portion located in the interlayer closest to the upper face or the lower face of the insulating substrate 1 where sublimation or the like of the platinum or the like to the outside air occurs most easily. Thus, even when a part of the platinum or the like has escaped to the outside (sublimation or the like has occurred), the fraction (the relative amount) of reduction of the line conductor 2 in the interlayer is suppressed relatively small. Thus, the fraction of change (increase) in the electric resistance value of the line conductor 2 is suppressed relatively small. Accordingly, it is possible to provide the wiring board 3 in which the detection accuracy for the temperature change based on a change in the electric resistance value is high and further the accuracy can be maintained over a long term.

Here, in the example shown in FIGS. 1 and 2, the distances from the upper face or the lower face to the closest interlayer is of the same order for the upper face and the lower face. Thus, in both of the interlayer closest to the upper face and the interlayer closest to the lower face, the line width of the line conductor 2 is relatively great.

Here, in the example shown in FIGS. 1 and 2, the line conductor 2 has a meander shape including a plurality of straight portions (no reference sign) aligned in parallel to each other; and a plurality of folded portions (no reference sign) connecting ends of adjacent straight portions among the plurality of straight portions. The folded portions alternately connects the ends of the plurality of straight portions adjacent to each other. In other words, the plurality of straight portions and the plurality of folded portions are successively connected in series so that one meander-shaped pattern (a meandering pattern) is formed.

When the line conductor 2 is in the meander-shaped pattern, the relatively long line conductor 2 is folded up and arranged successively. Thus, this has an advantage from the perspective of providing the line conductor 2 as long as possible in one interlayer. When the length of the line conductor 2 increases, the electric resistance value between the first end A and the second end B of the line conductor 2 can increase. That is, for example, since the electric resistance value of the line conductor 2 before temperature measurement (in the initial state described above like at an ordinary temperature) is relatively high, the absolute value of a change in the electric resistance caused by a temperature change is greater. Thus, accurate temperature measurement from an ordinary temperature to a high temperature range of about 1000° C. becomes easy.

Further, the terminals 4 disposed in the wiring board 3 are portions used for connecting the line conductor 2 to the external electric circuit. For example, the terminals 4 may be formed of a metallic material (platinum or the like) similar to the line conductor 2 by a similar method. Each terminal 4 in the wiring board 3 of the embodiment is in a pattern of rectangular shape formed of platinum. The terminal 4 may have another shape or, alternatively, may be formed of a lead terminal (not shown in FIGS. 1 and 2) formed of gold and the like or may contain a lead terminal.

As described later, the terminals 4 are located in a high temperature environment together with the wiring board 3 in some cases. Thus, it is preferable that the terminals 4 are formed of a metallic material having a high oxidation resistance at high temperatures such as a metal of platinum group containing platinum, or gold.

The wiring board 3 having the above-mentioned configuration and the terminals 4 for temperature measurement electrically connected to the line conductor 2 of the wiring board 3 constitute the temperature sensing element 5 of the embodiment. In the present embodiment, the electrical connection between the line conductor 2 and the terminals 4 is achieved by penetration conductors (so-called via conductors) 6 going through the insulating layers 1a in the thickness direction.

For example, the penetration conductors 6 are formed of a conductor material (a metallic material) comprising a metallic material (platinum or the like) as a main component, similar to the line conductor 2. Employable metallic materials include one obtained such that inorganic fillers such as alumina are added to platinum or a metal comprising platinum as a main component. For example, the inorganic fillers are used for the purpose of matching of the firing shrinkage rate, the contraction behavior, and the like between the two materials at the time when the penetration conductors 6 and the insulating substrate 1 are formed by co-firing.

For example, each penetration conductor 6 may be formed by filling metal paste of platinum similar to that used for forming the line conductor 2 is in a through hole provided in advance in the ceramic green sheet for constituting the insulating layer 1a; and then performing co-firing. For example, the through hole may be provided in the ceramic green sheet by a processing method such as mechanical drilling employing a metallic pin and drilling employing a laser beam. In this case, particles of the above-mentioned inorganic fillers may be added to the metal paste.

According to the temperature sensing element 5 having such a configuration, since the wiring board 3 having the above-mentioned configuration is included, it is possible to provide the temperature sensing element 5 in which high detection accuracy for the temperature change is obtained and the accuracy can be maintained over a long term.

For example, in a case of a measuring instrument for measuring the temperature of exhaust gas from an apparatus having a combustion part such as an internal combustion engine (e.g., a gasoline engine and a diesel engine), a gas turbine, and a boiler, temperature detection using the temperature sensing element 5 is performed as follows. That is, first, the temperature sensing element 5 is mounted on an external board provided with the above-mentioned circuit for electric resistance measurement and then the terminals 4 of the temperature sensing element 5 are electrically connected to predetermined sites of the circuit of an external board. Employable means of electrical connection include: joining with solder; and welding of lead wires (not shown) to the terminals 4. Then, the temperature sensing element 5 mounted on the external board is installed in a flow passage of the exhaust gas. In this case, it is sufficient that at least the temperature sensing element 5 is located in the inside of the exhaust gas. That is, the other parts of the external board need not be located in the inside of the exhaust gas. After that, the electric resistance value of the temperature sensing element 5 between the first end A and the second end B of the line conductor 2 included in the temperature sensing element 5 varies depending on the temperature of the exhaust gas and then the electric resistance value having varied is measured by the circuit for electric circuit measurement. On the basis the measured electric resistance value, it is possible to detect the temperature of the line conductor 2, that is, the temperature of the portion where the temperature sensing element 5 including the line conductor 2 is located, for example, from an electric resistance value-temperature relationship which has been measured in advance.

At the time of such temperature detection in a high temperature environment employing the temperature sensing element 5, the above-mentioned sublimation or the like of the platinum of the line conductor 2 easily occurs especially in the line conductor 2 disposed in the interlayer of the insulating layers 1a close to the upper face or the lower face.

In this case, when the line width of the line conductor 2 is set to be great in all of the plurality of interlayers of the plurality of insulating layers 1a, there is a possibility that a sufficiently high initial electric resistance value is not be achieved between the first end A and the second end B of the line conductor 2. Alternatively, there is a possibility that for the purpose of increasing the initial electric resistance value, the length of the line conductor 2 need be elongated and hence size reduction of the wiring board 3 becomes difficult. Thus, in the line conductor 2, the line width is set to be relatively great in the interlayer closest to the upper face of the insulating substrate 1 and in the interlayer closest to the lower face.

The line width of the line conductor 2 is set up suitably in accordance with conditions such as the accuracy of temperature measurement at temperatures to be measured, the temperature range, the thickness and the length of the line conductor 2, and the distance from the outer periphery of the insulating layer 1a to the line conductor 2; and conditions such as the productivity and the economic efficiency.

For example, in a case that the temperature range to be measured is a high temperature range of approximately 500 to 1000° C. and the line conductor 2 is formed of platinum (such as so-called pure platinum whose platinum content is 99.99 mass % or higher) and has a thickness of about 5 to 15 μm, for example, the line width of the line conductor 2 is set to be about 20 to 50 μm in the interlayer between the insulating layers 1a closest to the upper face or the lower face. Further, in this case, the line width of the line conductor 2 in the middle interlayer is set to be about 50 to 200 μm.

Here, with taking into consideration such thickness setting and the like of the line conductor 2, it is preferable that the insulating layer 1a is composed of a ceramic sintered body and the line conductor 2 is composed of a thick film conductor. That is, the insulating substrate 1 may include the plurality of insulating layers 1a which are each composed of a ceramic sintered body and are stacked on one another. In this case, for example, the line conductor 2 is formed by co-firing together with the insulating substrate 1 (the plurality of insulating layers 1a). When the line conductor 2 is composed of a thick film conductor, it is possible to easily achieve the thickness as relatively thick as about 10 μm or greater as described above. Further, since such a relatively thick line conductor 2 can be formed by co-firing together with the insulating substrate 1, this has advantages in the strength of joining between the line conductor 2 and the insulating substrate 1 and in the productivity as the wiring board 3. Further, it is possible to easily set up the pattern of the line conductor 2 merely by adjustment of the printing pattern for the metal paste for constituting the line conductor 2. Thus, this has advantages also in the flexibility of design, the productivity, and the like.

For example, employable ceramic sintered bodies for forming the insulating layer 1a include an aluminum-oxide based sintered body, an aluminum-nitride based sintered body, a mullite-based sintered body, and a glass-ceramic sintered body as described above. Further, for example, employable line conductors composed of a thick film conductor and formed by co-firing together with the insulating substrate 1 include one obtained such that co-firing of metal paste of platinum for constituting the insulating layer 1a is formed together with a ceramic green sheet as described above.

Further, when the insulating substrate 1 includes the plurality of insulating layers 1a which are each composed of an aluminum oxide sintered body and are stacked on one another, among the plurality of insulating layers 1a each composed of an aluminum-oxide based sintered body, the lower insulating layers 1a may be each composed of an aluminum oxide sintered body of higher purity than that of the uppermost insulating layer 1a.

In this case, the lower insulating layers 1a have a relatively high purity and a relatively low glass content. Thus, even when a high temperature of about hundreds to 1000° C. is to be measured, since the lower insulating layers 1a have a low content of glass which easily flows at high temperatures, deformation in the lower insulating layers 1a is more effectively suppressed. As a result, the line conductor 2 disposed in the lower insulating layers 1a is less prone to suffer deformation.

Further, when the aluminum oxide sintered body is constructed such that the lower insulating layers 1a have a higher purity than the uppermost insulating layer 1a, that is, the uppermost insulating layer 1a has a lower purity than the lower insulating layers 1a as described above, at the time of firing, larger portions of the metallic material of the terminal 4 disposed in the uppermost insulating layer 1a and the metallic material of the penetration conductor 6 get wet with the glass contained in the uppermost insulating layer 1a in a relatively high content. This improves the strength of joining by the glass between the uppermost insulating layer 1a and the terminal 4 or the penetration conductor 6.

Here, in this case, the purity of aluminum oxide in the uppermost insulating layer 1a is 90 to 93 mass % in terms of a content percentage of aluminum oxide and the purity of aluminum oxide in the lower insulating layers 1a is approximately 92 to 99.9 mass % in terms of a content percentage of aluminum oxide. In the case of such purities, the lower insulating layers 1a have a lower content of glass which easily flows at high temperatures. Thus, even when a high temperature of about hundreds to 1000° C. is to be measured, deformation in the lower insulating layers 1a is suppressed further. As a result, the line conductor 2 disposed in the lower insulating layers 1a is less prone to suffer deformation. Thus, this has an advantage in improvement of the accuracy of temperature measurement.

Further, when the uppermost insulating layer 1a contains glass in a higher content, larger portions of the metallic material of the terminal 4 and the metallic material of the penetration conductor 6 get wet. This effectively improves the joining strength between the uppermost insulating layer 1a and the terminal 4 or the penetration conductor 6. Thus, this has an advantage in improvement of the reliability as the wiring board 3.

Here, when the line conductor 2 is not disposed in the lowermost insulating layer 1a, not only the uppermost insulating layer 1a but also the lowermost layer insulating layer 1a may have a lower aluminum oxide purity similarly to the uppermost insulating layer 1a. When such a configuration is employed, the terminal 4 and the penetration conductor 6 can easily be disposed also in the lowermost insulating layer 1a. Thus, for example, this has advantages in the flexibility of design as the wiring board 3 and in improvement of the practicability or the like.

Figure 3:
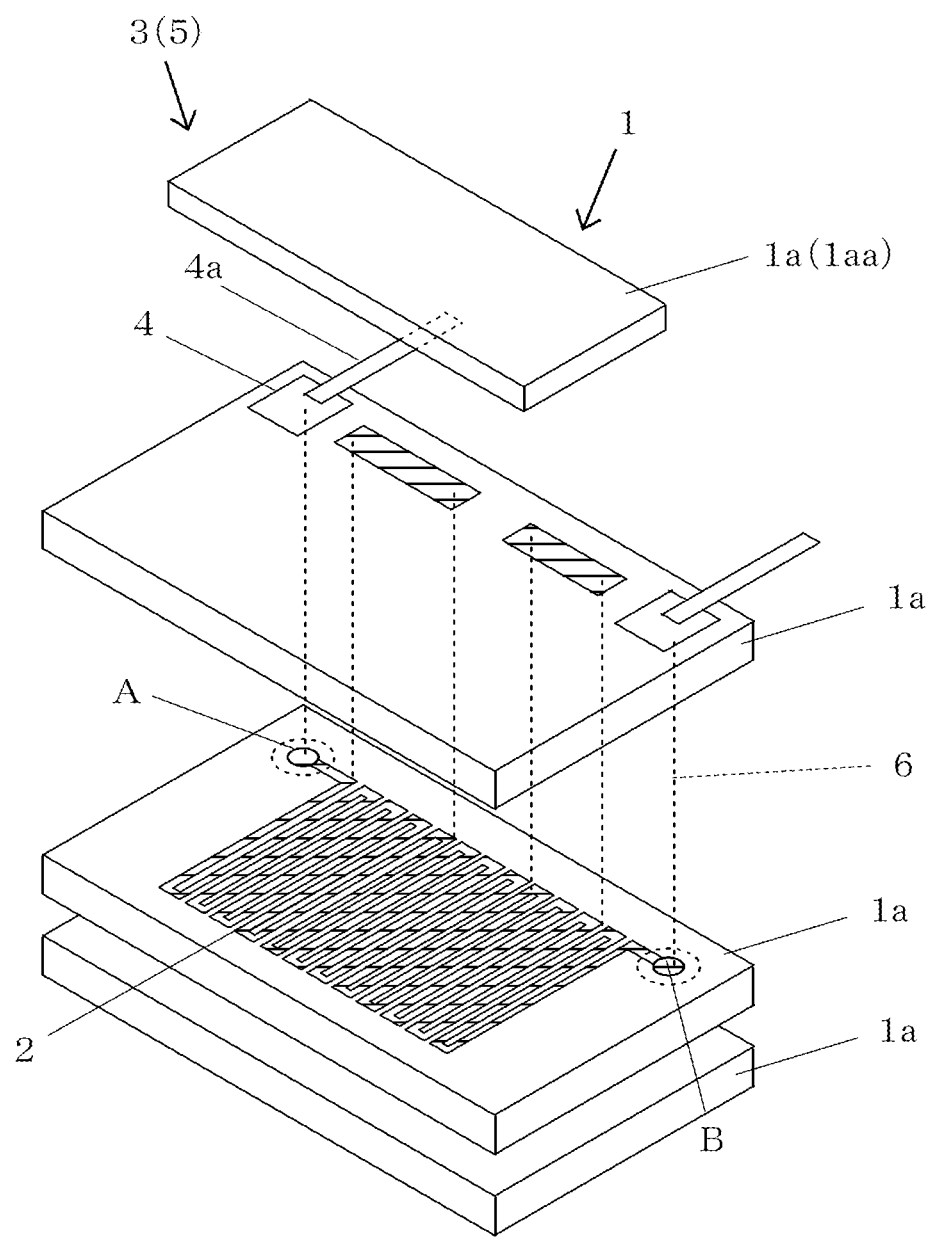
FIG. 3 is an exploded perspective view showing a modified example of the wiring board and the temperature sensing element shown in FIG. 1.

FIG. 3 is an exploded perspective view showing a modified example of the wiring board and the temperature sensing element shown in FIGS. 1 and 2. In FIG. 3, portions similar to those in FIGS. 1 and 2 are designated by similar reference signs.

In the example shown in FIG. 3, four insulating layers 1a are stacked on one another and then the line conductor 2 is disposed in two interlayers which are located on the upper side and in the middle part. The line conductor 2 is not disposed in the lower interlayer. In this case, for example, as described above, the terminals 4, the penetration conductors 6, and the like may be disposed in the lowermost insulating layer 1a. Further, also in the present example, the line width of the line conductor 2 (2a) disposed in the upper interlayer closest to the upper face of the insulating substrate 1 is greater than the line width of the line conductor 2 (2b) disposed in the middle interlayer.

Thus, within the line conductor 2, the amount of platinum or the like is relatively high in the line conductor 2 (2a) located in the upper interlayer where sublimation or the like of the platinum or the like to the outside air occurs most easily. Thus, the fraction (the relative amount) of reduction of the line conductor 2 (2a) caused by the sublimation or the like of the platinum is suppressed relatively small. Accordingly, also in this case, it is possible to provide the wiring board 3 in which the detection accuracy for the temperature change based on a change in the electric resistance value is high and further the accuracy can be maintained over a long term.

Here, in the example shown in FIG. 3, the two line conductors 2 (2a, 2b) disposed in the two interlayers are connected in parallel to each other and hence may be recognized as one parallel-connected resistor. The first and second ends A and B of the entirety of the line conductor 2 belong to the line conductor 2 (2b) disposed in the middle interlayer. The first end A and the second end B are electrically led out through the penetration conductors 6 to the upper face of the insulating substrate 1 and then electrically connected to the terminals 4. By virtue of this, there is formed the temperature sensing element 5 in which a change in the electric resistance value of the entirety of the line conductor 2 is measured so that the temperature can be detected.

Further, in the example shown in FIG. 3, for example, when the line width is reduced (trimmed) in a part in the length direction of the line conductor 2 (2a) disposed in the upper interlayer, it is possible to adjust the electric resistance value (the initial electric resistance value) of the line conductor 2 recognized as a parallel-connected resistor. That is, the line conductor 2 (2a) disposed in the upper interlayer may be utilized as a so-called trimming pattern. Thus, in this case, it is possible to provide the wiring board 3 and the temperature sensing element 5 which are more advantageous in the accuracy, the practicability (the so-called user friendliness), and the like of temperature measurement.

In this case, for the purpose of easiness of trimming of the line conductor 2 (2a), the uppermost insulating layer 1a (1aa) may be formed of a glass material. When the uppermost insulating layer 1a (1aa) is formed of a glass material, for example, the insulating layer 1a having a higher aluminum oxide purity as described above is the insulating layer 1a immediately under the insulating layer 1a (1aa) formed of a glass material.

Further, in the example shown in FIG. 3, each terminal 4 includes a lead terminal 4a. In this case, actually, the lead terminals 4a are connected (joined) to the external electric circuit. When the lead terminals 4a are provided, electrical connection to the external electric circuit becomes easier. For example, each lead terminal 4a joined to a patterned part having a rectangular shape within the terminal 4 by using a brazing material such as gold. For example, the joining of the lead terminals 4a to the external electric circuit is achieved by a method such as brazing employing gold as a brazing material, or mechanical pressure bonding.

Second Embodiment

Figure 4:
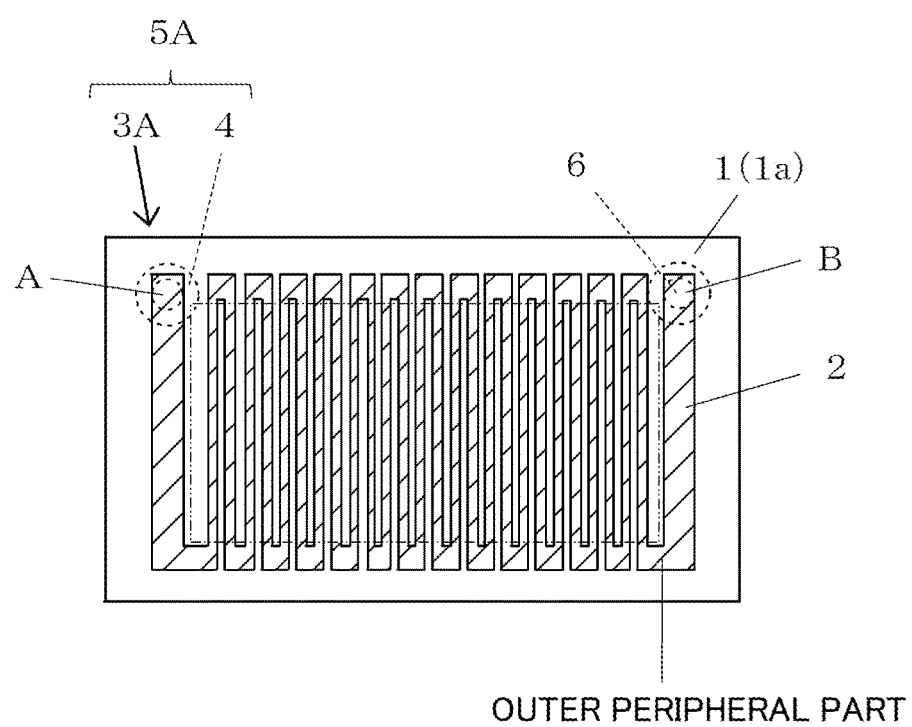
FIG. 4 is a transparent plan view showing a wiring board and a temperature sensing element according to a second embodiment of the invention.
Figure 5:
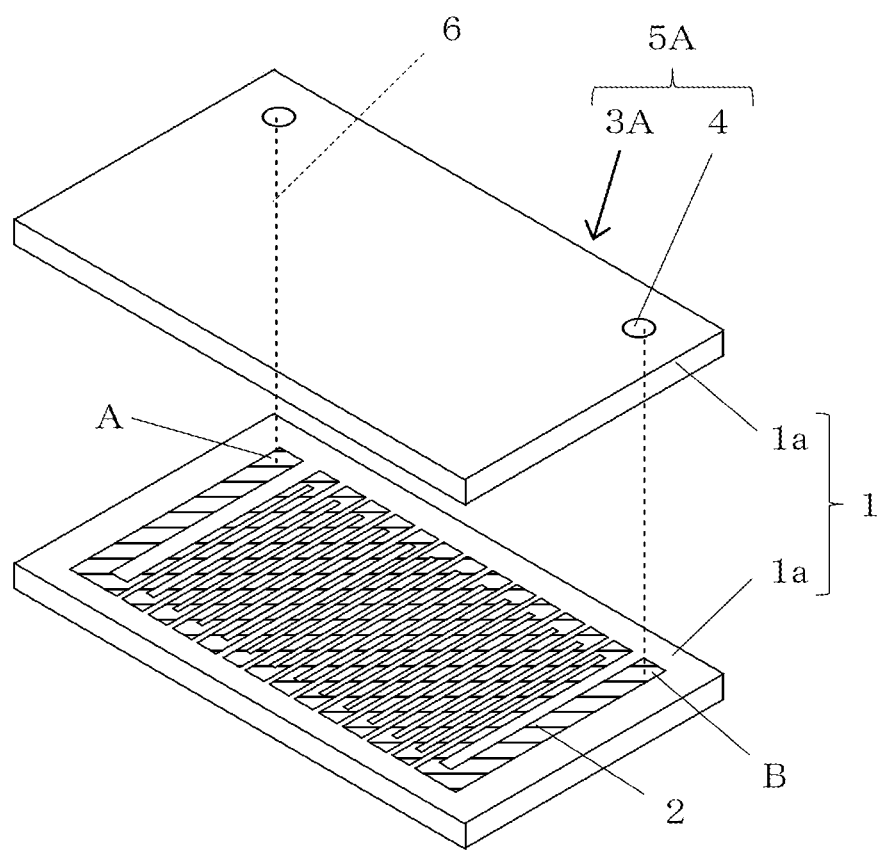
FIG. 5 is an exploded perspective view of the wiring board and the temperature sensing element shown in FIG. 4.

FIG. 4 is a diagram showing a wiring board and a temperature sensing element according to a second embodiment of the invention. FIG. 5 is an exploded perspective view of the wiring board and the temperature sensing element shown in FIG. 4. In the wiring board 3A of the second embodiment, two insulating layers 1a are stacked on one another, and then a line conductor 2 is disposed in one interlayer thereof. Further, in the line conductor 2 in the wiring board 3A, the line width in an outer peripheral part (simply referred to as an outer peripheral part, hereinafter) close to a side face of the insulating layer 1a is greater than the line width in the other portions. The other points in the second embodiment are similar to those of the first embodiment and hence description of the similar points is omitted. For example, the portion of the line conductor 2 which faces a side face of the insulating substrate indicates a portion which is located outside the portion surrounded by a dashed double-dotted line in FIG. 4 where any other line conductor (not shown) is not disposed between itself and the side face, the portion being close to the side face.

As shown in FIGS. 4 and 5, similarly to the first embodiment, the line conductor 2 is in a meander-shaped pattern including a plurality of straight portions (no reference sign) and a plurality of folded portions (no reference sign). The folded portions alternately connect the ends of the plurality of straight portions adjacent to each other. In other words, the plurality of straight portions and the plurality of folded portions are successively connected in series so that one meander-shaped pattern is formed.

Within the line conductor 2 formed in the meander-shaped pattern, for the purpose of ensuring the length of the straight portions, that is, the length of the entirety of the line conductor 2, to be as long as possible, each folded portion is disposed at a position close to the outer periphery of the insulating layer, that is, at a position as close as possible to the side face of the insulating substrate 1. Further, among the straight portions, a portion located on the outermost side is located close to a side face of the insulating substrate 1.

When the line conductor 2 is in the meander-shaped pattern, the relatively long line conductor 2 is folded up and arranged successively. Thus, this has an advantage in providing the line conductor 2 as long as possible in one interlayer. When the length of the line conductor 2 increases, the electric resistance value between the first end A and the second end B of the line conductor 2 can increase. That is, for example, since the electric resistance value of the line conductor 2 before temperature measurement (in the initial state described above like at an ordinary temperature) is relatively high, the absolute value of a change in the electric resistance caused by a temperature change is greater. Thus, accurate temperature measurement from an ordinary temperature to a high temperature range of about 1000° C. becomes easy.

In the line conductor 2, within the meander-shaped pattern, line widths of a straight portion located on the outermost side and the folded portions are greater than line widths of the other straight portions. By virtue of this, for example, it is possible to easily realize the line conductor 2 in which the line width in the outer peripheral part along the outer periphery of the insulating layer 1a having a quadrangular shape is greater than the line width in the other portions.

That is, also in the second embodiment, within the line conductor 2, the amount of platinum or the like is relatively high in the portion where sublimation or the like of the platinum or the like to the outside air occurs most easily. Thus, even when a part of the platinum or the like of the line conductor 2 sublimates to the outside, the fraction (the relative amount) of reduction of the line conductor in that portion is suppressed relatively small. By virtue of this, the fraction of change (increase) in the electric resistance value of the line conductor 2 is suppressed relatively small. Thus, also in the second embodiment, it is possible to provide the wiring board 3A and the temperature sensing element 5A in which the detection accuracy for the temperature change based on a change in the electric resistance value is high and further the accuracy can be maintained over a long term.

Here, the dimensions for the line width of the line conductor 2 in the example shown in FIGS. 4 and 5 are mentioned on the basis of comparison within one interlayer. Then, within one interlayer, the line width in the outer peripheral part is relatively great. When a plurality of interlayers are included in one wiring board 3, in each of the plurality of interlayers, the line width in the outer peripheral part may be set to be relatively great.

In this case, when the line width over the entire length of the line conductor 2 is set to be relatively great, the space where the line conductor 2 is disposed within the interlayer of the insulating layer 1a becomes larger. This causes a tendency that size reduction of the wiring board 3 and the temperature sensing element 5 becomes difficult. Further, there is a tendency that the electric resistance value (especially, the initial electric resistance value described above) between the first end A and the second end B of the line conductor 2 becomes relatively low and hence there is a tendency that the absolute value of the change in the electric resistance caused by a temperature change becomes small. Thus, there is a possibility that the detection accuracy for the electric resistance (and hence for the temperature) becomes low. Thus, in the line conductor 2, only a part in the length direction has a greater width than the other portions.

Further, for example, in a case where the insulating layer 1a has a quadrangular shape as shown in the example in FIGS. 4 and 5, when the line conductor 2 is in a meander-shaped pattern, the following effects are obtained when the straight portions and the folded portions within the line conductor 2 in the meander-shaped pattern are arranged in parallel to the outer periphery of the insulating layer 1a. That is, in this case, the distance from the outer periphery of the insulating layer 1a to the line conductor 2 closest to the outer periphery is set to be substantially the same in each of the straight portion and the folded portion. Thus, this reduces a possibility that the distance from the outer periphery of the insulating layer 1a to the line conductor 2 becomes extremely close in a part in each of the straight portion and the folded portion so that the platinum of the line conductor 2 easily sublimates to the outside.

Further, in this case, the line width in the portion whose line width is relatively great may be of the same order in each of the straight portion and the folded portion and, further, the distance between the outer periphery of the insulating layer 1a and each of the straight portions and the folded portion and may be of the same order. In this case, the distance from the outer periphery to the line conductor 2 becomes of the same order substantially in the entirety of the outer periphery of the insulating layer 1a. This reduces further a possibility that the sublimation of the platinum to the outside is accelerated in a part in the length direction of the line conductor 2.

In such a line conductor 2, the shape of the entirety may be recognized as a quadrangular shape substantially similar to (smaller than) the interlayer of the insulating layer 1a having a quadrangular shape. That is, the outer periphery of the entirety of the line conductor 2 having the quadrangular shape is arranged in parallel to the outer periphery of the insulating layer 1a having the quadrangular shape. Then, the line width in the outer peripheral part of the entirety of the line conductor 2 of the quadrangular shape is greater than the line width in the other portion (the center part).

Thus, in the wiring board 3A and the temperature sensing element 5A, when the accuracy of temperature measurement, the long term reliability, and the like are regarded as important, it is preferable that the line conductor 2 is formed in the meander-shaped pattern and, further, the straight portion and the folded portion are arranged in parallel to the outer periphery of the insulating layer 1a. Further, in a case where the insulating layer 1a (the insulating substrate 1) has a quadrangular shape, for example, when the wiring board 3 is to be manufactured in a form of a segmentable board (not shown) in which a plurality of regions each constituting the insulating substrate 1 are arranged and formed in one mother board, the arrangement thereof becomes easy. That is, this configuration is more advantageous in the productivity as the wiring board 3A, the economic efficiency, and the like.

Here, in the example shown in FIGS. 4 and 5, in the interlayer of the insulating layer 1a having a rectangular shape, the straight portions of the line conductor 2 in the meander-shaped pattern are arranged along the short side direction and the folded portions are arranged along the long side direction. That is, the length of the straight portion is relatively short and the number of folded portions is relatively great. In this case, the length of each single segment portion within the line conductor 2 is relatively short. Further, the length of the outer peripheral part close to the outer periphery of the insulating layer 1a within the line conductor 2 is also relatively short. Thus, for example, it is possible to easily reduce a thermal stress caused by a difference in the thermal expansion coefficient between the insulating layer 1a and the line conductor 2 and hence this has an advantage in reduction of a possibility of mechanical breakage of the insulating layer 1a and the line conductor 2 caused by the thermal stress.

Figure 6:
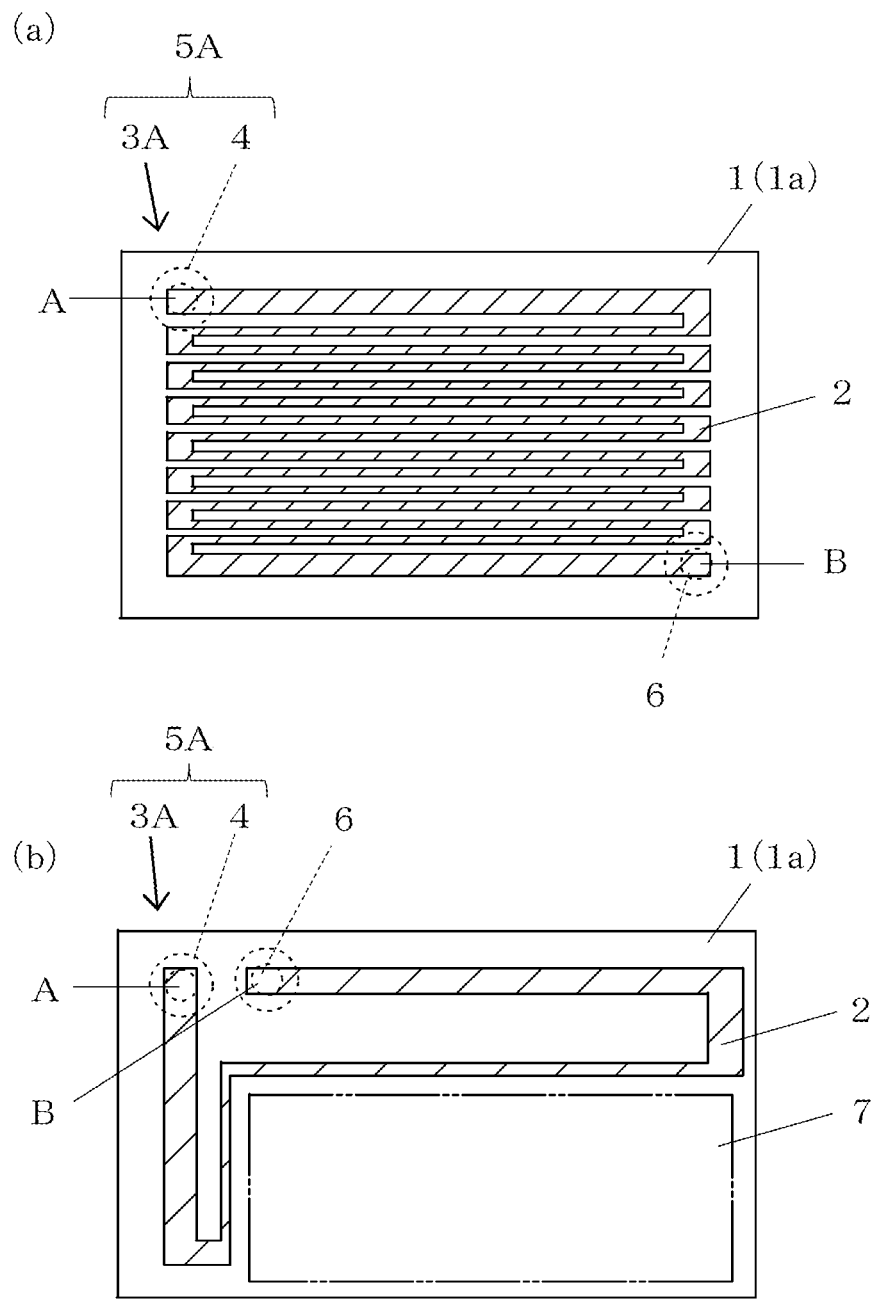
FIGS. 6(a) and 6(b) are transparent plan views respectively showing a modified example of the wiring board and the temperature sensing element shown in FIG. 4.

FIGS. 6(a) and 6(b) are transparent plan views (where the insulating layer above the line conductor 2 is omitted) respectively showing a modified example of the wiring board 3A and the temperature sensing element 5A shown in FIGS. 4 and 5. In FIG. 6, portions similar to those in FIGS. 4 and 5 are designated by similar reference signs. In the example shown in FIG. 6, the insulating substrate 1 has a quadrangular (rectangular) plate shape similarly to the example shown in FIGS. 4 and 5. However, the pattern of the line conductor 2 is different from the example shown respectively in FIGS. 4 and 5. The example shown in FIG. 6 is basically similar to the example shown in FIGS. 4 and 5 except for the pattern of the line conductor 2. Description is omitted for the points similar to those of the example in the embodiment given above.

In the example shown in FIG. 6(a), the line conductor 2 having the meander-shaped pattern is arranged such that the straight portions align with the long side direction of the insulating layer 1a (in an interlayer) having a rectangular shape. Further, the folded portions are arranged along the short side direction. In this case, for example, when the metal paste for constituting the line conductor 2 is applied by a method such as screen printing, the following advantageous effect is obtained. That is, in a printing method, blurring of the metal paste easily occurs in the turn-back portions (boundary portions each between a folded portion and a straight portion). Thus, when the number of folded portions is reduced, the blurring is reduced so that the electric resistance value of the entirety of the line conductor 2 can be increased. In the mode of FIG. 6(a), the number of folded portions is smaller than in the example shown in FIG. 1 and hence the electric resistance value of the entirety can be more easily increased.

Also in the mode shown in FIG. 6(a), within the line conductor 2 formed in the meander-shaped pattern, the line widths of the straight portion located on the outermost side and the folded portions are greater than the line widths of the other straight portions. Thus, a change in the electric resistance value (the initial electric resistance value) of the line conductor 2 caused by the sublimation or the like of the platinum as described above is suppressed. Accordingly, it is possible to provide the wiring board 3A and the temperature sensing element 5A in which the accuracy of temperature measurement is maintained over a long term.

In the example shown in FIG. 6(b), the line conductor 2 having a broken-line shaped pattern is disposed in the interlayer. The number of times of bending is smaller than in the example shown in FIGS. 1 and 2 (the number of folded portions is only two) and hence a meander-shaped pattern is not formed. The line widths of the two folded portions of the line conductor 2 and the straight portion which faces the side face of the insulating substrate 1 are greater than the line widths of the other portions. In the present example, the line conductor 2 has an "L" shape (a shape obtained by rotating an "L" rightward by 90 degrees) in its entirety. On the outside of the "L" shape region, an auxiliary space 7 is provided where other conductors (not shown) or the like may be arranged. For example, employable other conductors allowed to be disposed in the auxiliary space 7 include: a wiring conductor to which an electronic component (not shown) such as a capacitive element mounted on the wiring board 3 is electrically connected; a conductor such as a grounding conductor; and a wiring for heater. Also in this case, it is possible to provide the wiring board 3A and the temperature sensing element 5A having a high accuracy in the temperature measurement. Here, even when the number of folded portions is one alone, similarly, it is sufficient that the line widths of the one folded portion and the straight portion which faces the side face of the insulating substrate 1 of the line conductor 2 are set to be greater than the line widths of the other straight portions.

The shape of the entirety of the line conductor 2 in a case where the auxiliary space 7 is provided is not limited to that shown in FIG. 3(b) and may be another. Further, within the interlayer of the insulating layer 1a, the portion where the line conductor 2 is not disposed may be provided for other applications such as reduction of the thermal stress between the insulating layer 1a and the line conductor 2 or improvement of the electric insulation within the pattern of the line conductor 2.

Figure 7:
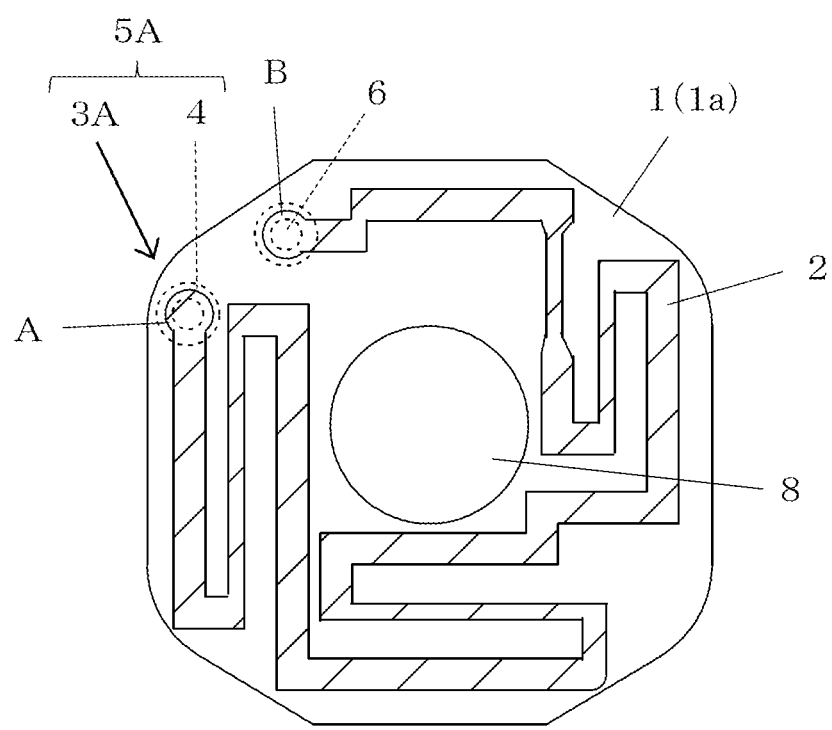
FIG. 7 is a transparent plan view showing another modified example of the wiring board and the temperature sensing element shown in FIG. 4.

FIG. 7 is a transparent plan view showing another modified example of the wiring board 3A and the temperature sensing element 5A shown in FIGS. 4 and 5. In FIG. 7, portions similar to those in FIGS. 4 and 5 are designated by similar reference signs. In the example shown in FIG. 7, the insulating layer 1a or the insulating substrate 1 in a plan view thereof has an octagonal shape whose corners are formed in an arc shape. Further, a penetrating part 8 going through the insulating substrate 1 in the thickness direction is disposed in the center part of the insulating substrate 1.

For example, the penetrating part 8 is used for positioning between the wiring board 3A or the temperature sensing element 5A and an external board on which the wiring board 3A or the temperature sensing element 5A is to be mounted or for improvement of the strength of connection. Within the external board, a protruding portion is disposed in advance in the portion onto which the wiring board 3A or the temperature sensing element 5A is to be mounted. Then, the penetrating part 8 is fit onto the protruding portion so that positioning of the wiring board 3A and the temperature sensing element 5A is achieved. Further, the penetrating part 8 may be used for another application such as a space for mounting of a component part in a case where this another component part is to be mounted on the external board.

In the example shown in FIG. 7, the line conductor 2 is in a broken-line pattern. A part thereof includes a meander-shaped portion. However, the number of times of turn-back is two, three, or the like, which is smaller than that of the example shown in FIGS. 1 and 2. The line conductor 2 in its entirety has a substantially annular shape surrounding the penetrating part 8.

In the example shown in FIG. 7, the portion of the line conductor 2 whose line width is relatively great is disposed also in the portion along the periphery of the penetrating part in addition to the portion along the outer periphery (the outer side surface of the insulating substrate 1) on the outside of the insulating layer 1a. That is, the line width of the portion of the line conductor 2 relatively close to the outside air (the outside) is greater than the line widths of the other portions. Also in the example shown in FIG. 7, the line width of the portion of the line conductor 2 close to the outside is greater than the line widths of the other portions of the line conductor 2. Thus, a change in the electric resistance value (the initial electric resistance value) of the line conductor 2 caused by the sublimation or the like of the platinum as described above is suppressed. Accordingly, it is possible to provide the wiring board 3A and the temperature sensing element 5A in which the accuracy of temperature measurement is maintained over a long term.

Here, in the example shown in FIG. 7, the line conductor 2 includes a portion not parallel to the outer periphery of the insulating layer 1a. As such, the line conductor 2 need not be in parallel to the outer periphery of the insulating layer 1a.

Third Embodiment

Figure 8:
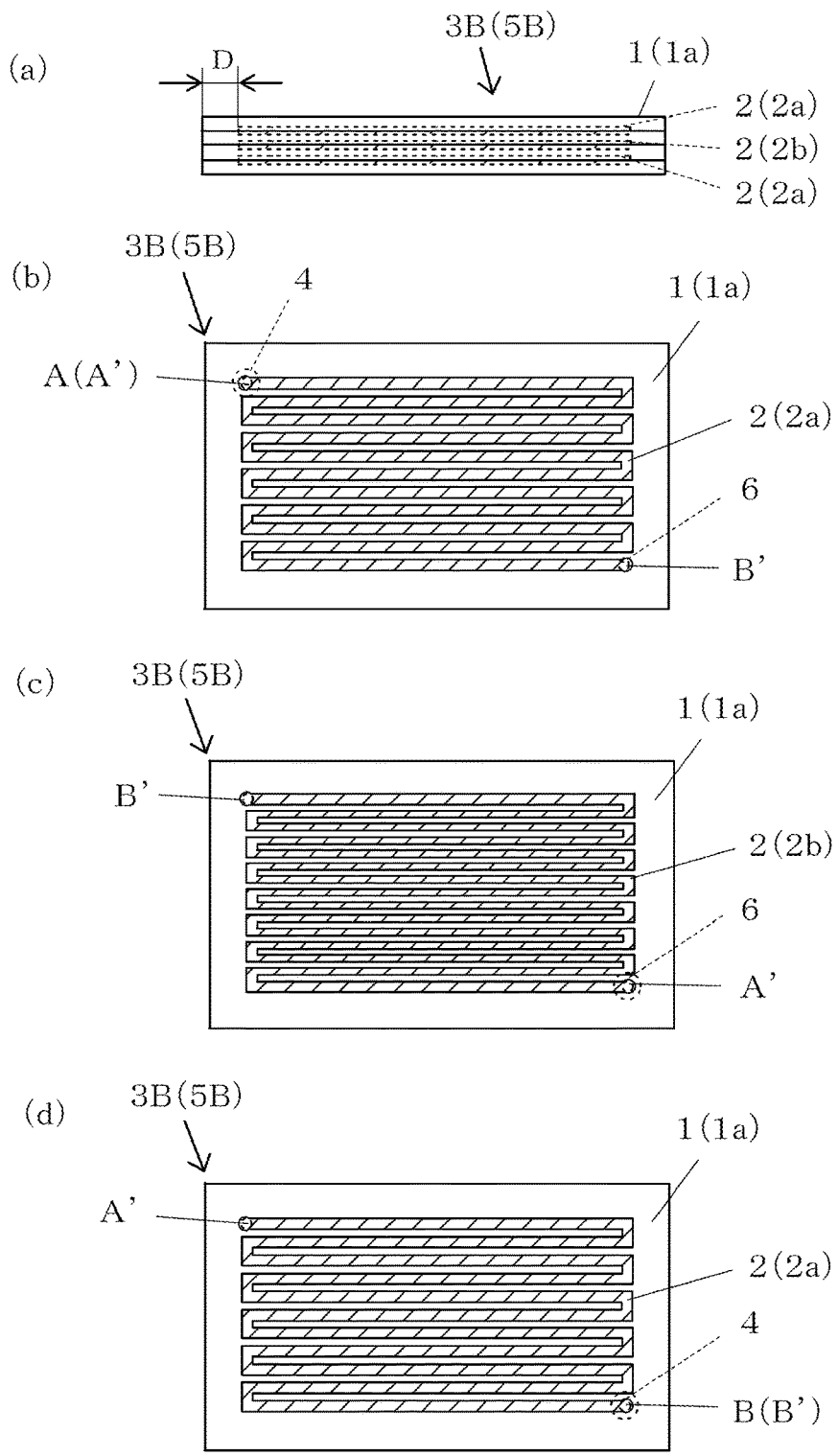
FIG. 8(a) is a side view showing a wiring board and a temperature sensing element according to a third embodiment of the invention.
FIGS. 8(b) to 8(d) are plan views each showing each insulating layer in an exploded manner.

FIG. 8(a) is a side view showing a wiring board 3B and a temperature sensing element 5B of a third embodiment of the invention, and FIGS. 8(b) to 8(d) are plan views each showing each insulating layer in an exploded manner. In the example of the present embodiment, the insulating layer 1a shown in FIG. 8(c) is stacked on the insulating layer 1a shown in FIG. 8(d) and then the insulating layer 1a shown in FIG. 8(b) is stacked on the insulating layer 1a shown in FIG. 8(c). Also in this modified example, another insulating layer 1a is further stacked on the insulating layer 1a shown in FIG. 8(a) so that the insulating substrate 1 is formed. Here, also in FIG. 8, portions similar to those in FIGS. 1 and 2 are designated by similar reference signs. The wiring board 3B and the temperature sensing element 5B of the third embodiment have a configuration that the wiring boards 3 and 3A and the temperature sensing elements 5 and 5A of the first and second embodiments are facing each other. In the following description, description is omitted for the points similar to those of the first and the second embodiment.

In the example shown in FIG. 8, the line conductor 2 in each of three interlayers is in a similar meander-shaped pattern. Similarly to the wiring board 3 and the temperature sensing element 5 of the first embodiment, in the three line conductors 2, the line width of the line conductor 2 (2a) disposed in the upper or lower interlayer is greater than the line width of the line conductor 2 (2b) disposed in the middle interlayer.

Further, in the line conductor 2 (2b) located in the middle interlayer where the line width is relatively small, similarly to the second embodiment, the line widths of the straight portions which faces the side face of the insulating substrate 1 and the folded portions are greater than the line widths of the other portions. Within the line conductor 2 (2b) located in the middle interlayer, the line widths of the straight portions which faces the side face of the insulating substrate 1 and the folded portions are, for example, of the same order as the line width of the line conductor 2 (2*a*) in the interlayer on the upper face side and in the interlayer on the lower face side.

Also in this case, within the line conductor 2 (2*a*, 2*b*), the amount of platinum or the like is relatively high in the upper and the lower interlayer where sublimation or the like of the platinum or the like to the outside air occurs most easily. Further, also in the middle interlayer, the line width of the line conductor 2 (2*b*) in the portion closest to the side face of the insulating substrate 1, that is, in the straight portions which faces the side face of the insulating substrate 1 and in the folded portions is relatively great. Thus, similarly to the first and second embodiments, sublimation of the platinum or the like to the outside is suppressed and hence the fraction of change (increase) in the electric resistance value of the line conductor 2 (2*a*, 2*b*) is suppressed relatively small. As a result, the wiring board 3B and the temperature sensing element 5B can be provided in which the detection accuracy for the temperature change or the like is high.

Further, in this case, also in the middle interlayer where the line width of the line conductor 2 (2*b*) is relatively small, within the line conductor 2 (2*b*), the line widths of the straight portions closest to the side face (the outer surface) of the insulating substrate 1 and the folded portions are relatively great. Thus, it is possible to more effectively reduce the fraction of a change in the electric resistance value of the line conductor 2 (2*b*). Accordingly, it is possible to provide the wiring board 3B and the temperature sensing element 5B which are more effective in increasing the detection accuracy for the temperature change or the like.

The wiring board 3B and the temperature sensing element 5B in which in the middle interlayer, within the line conductor 2 (2*b*), the line widths of the straight portions which faces the side face of the insulating substrate 1 and the folded portions are set to be relatively great are effective even when a distance D from the outer periphery of the line conductor 2 (2*b*) to the outer periphery of the insulating layer 1*a* is relatively small. For example, even when the distance D is close to the thickness of the insulating layer 1*a*, it is possible to suppress undesired fluctuation in the electric resistance value of the line conductor 2 (2*b*) especially caused by the sublimation of the platinum from the outer peripheral part.

Here, for example, the distance D from the outer periphery of the line conductor 2 (2*b*) to the outer periphery of the insulating layer 1*a* is set to be about 100 to 200 μm. Further, for example, the thickness of the insulating layer 1*a* is set to be about 50 to 200 μm.

Figure 9:
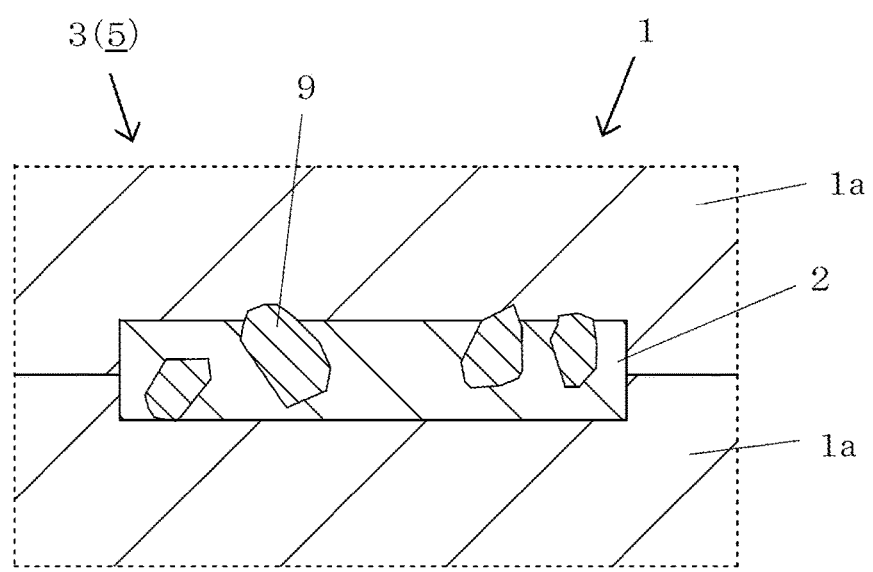
FIG. 9 is a sectional view showing in an enlarged manner an example of the line conductor portion according to each embodiment of the invention.

FIG. 9 is a sectional view showing in an enlarged manner an example of the line conductor 2 portion of each embodiment given above. In FIG. 9, portions similar to those in FIG. 1 or the like are designated by similar reference signs. In the example shown in FIG. 9, a granular insulating body 9 enters at least a part of in the line conductor 2 in the thickness direction thereof. In other words, the granular insulating body 9 having a certain length in the thickness direction of the line conductor 2 is contained in the line conductor 2.

In this case, for example, even in a high temperature environment in which the wiring board 3 and the temperature sensing element 5 are used, the fluidity of the metallic component such as platinum in the line conductor 2 is suppressed by the insulating body 9. That is, flowing of the platinum or the like is suppressed by the insulating body 9.

Thus, diffusion of the platinum or the like into the inside of the insulating substrate 1 (the insulating layer 1*a* in direct contact with the line conductor 2) in the high temperature environment is suppressed. By virtue of this, occurrence of voids or the like in the inside of the line conductor 2 caused by the diffusion of the platinum or the like into the inside of the insulating substrate 1 is more effectively suppressed. Thus, for example, a thermal shock resistance and the like are improved further and hence it is possible to provide the wiring board 3 and the temperature sensing element 5 having yet higher long term reliability. Such an effect is obtained similarly to the wiring boards 3A and 3B and the temperature sensing elements 5A and 5B of the second and the third embodiment.

Here, for example, the granular insulating body 9 may have an irregular shape like in the example shown in FIG. 9 or, alternatively, may have another shape such as a circular shape (a spherical shape) and an elliptical shape in a sectional view. However, in the granular insulating body 9, in order to ensure a larger area of contact with the line conductor 2 per fixed volume so that the diffusion of the platinum or the like may be suppressed, a shape having depressions and protrusions in the surface is suitable.

For example, the granular insulating body 9 may be a crystal grain of a ceramic material similar to that forming the insulating substrate 1 or, may be one containing a plurality of such crystal grains (a sintered body of polycrystal structure). Further, a glass material or the like may be employed.

When the insulating body 9 is composed of a ceramic particle, the stability of the insulating body 9 is high even in a high temperature environment. Thus, it is possible to more effectively obtain the effect of suppressing the diffusion of the platinum or the like of the line conductor 2. Thus, from the perspective of the reliability and the like of the wiring board 3 and the temperature sensing element 5, it is preferable that the granular insulating body 9 is composed of a ceramic particle.

Further, when the insulating substrate 1 is composed of a ceramic sintered body, the ceramic material similar to this ceramic sintered body can easily be used as the material of the insulating body 9. Thus, this has advantages in the productivity of the wiring board 3 and the temperature sensing element 5 and in the economic efficiency or the like.

Further, when the ceramic particle employed as the insulating body 9 contains at least one selected from aluminum oxide, zirconium oxide, zirconium silicate, and magnesium oxide, for example, this configuration is more advantageous from the perspective of the strength or the like of joining between the insulating layer 1*a* including an aluminum-oxide based sintered body or the like and the insulating body 9.

In this case, the insulating body 9 may contain more than one of such materials. When more than one of materials are contained, these materials may form the insulating body 9 independently of each other. Alternatively, more than one of materials may be contained in one insulating body 9 in the form of a polycrystalline material.

Here, the wiring board 3 and the temperature sensing element 5 of the invention are not limited to the examples of the embodiments given above. That is, various modifications are possible within the scope of the invention. For example, the line conductor (not shown) may be arranged in four or more interlayers. Further, the line width of each line conductor may be set to be greater in the interlayer located closer from the upper face or the lower face (the principal surface closer from the line conductor) of the insulating substrate 1. Further, also in the line conductor 2 of the wiring board 3 and the temperature sensing element 5 of the first embodiment, employable patterns for the conductor are not limited to the meander-shaped pattern shown in FIGS. 1 and 2 and hence another pattern may be employed.

REFERENCE SIGNS LIST

1: Insulating substrate
1a: Insulating layer
2: Line conductor
2a, 2b: Line conductor
3: Wiring board
3A, 3B: Wiring board
4: Terminal
5: Temperature sensing element
5A, 5B: Temperature sensing element
6: Penetration conductor
7: Auxiliary space
8: Penetrating part
9: Insulating body

The invention claimed is:

1. A wiring board, comprising:
an insulating substrate composed of a stack of a plurality of insulating layers, the insulating substrate having an upper face, a lower face, and side faces; and
a plurality of line conductors formed of platinum or a metallic material comprising platinum as a main component, the plurality of line conductors each including a first end and a second end located on a side opposite to the first end, the plurality of line conductors being respectively disposed in interlayers between the plurality of insulating layers,
in the line conductors, a line width of a line conductor located in an interlayer among the interlayers which interlayer is closest to the upper face or the lower face of the insulating substrate being greater than a line width of a line conductor located in each of the other interlayers.

2. A wiring board, comprising:
an insulating substrate composed of a stack of a plurality of insulating layers, the insulating substrate having an upper face, a lower face, and side faces; and
a line conductor formed of platinum or a metallic material comprising platinum as a main component, the line conductor including a first end and a second end located on a side opposite to the first end, the line conductor being disposed between the plurality of insulating layers in a pattern including at least one folded portion which faces a side face of the insulating substrate,
line widths of the at least one folded portion and a portion of the line conductor which faces the side face of the insulating substrate being greater than line widths of the other portions of the line conductor,
the line conductor having a meander-shaped pattern including a plurality of straight portions aligned in parallel to each other and a plurality of folded portions each connecting ends of adjacent straight portions among the plurality of straight portions, and within the meander-shaped pattern, line widths of a straight portion located on the outermost side and the plurality of folded portions being greater than line widths of the other straight portions.

3. The wiring board according to claim 1, wherein the insulating substrate includes a plurality of insulating layers which are each composed of a ceramic sintered body and are stacked on one another, and the line conductor or the line conductors are composed of a thick film conductor.

4. The wiring board according to claim 3, wherein the ceramic sintered body is an aluminum-oxide based sintered body, and among the plurality of insulating layers, a lower insulating layer is an aluminum oxide sintered body of higher purity than a purity of the aluminum oxide sintered body of the uppermost insulating layer.

5. The wiring board according to claim 2, wherein the insulating layer has a quadrangular shape, and in the meander-shaped pattern, the straight portions and the folded portions are arranged in parallel to an outer periphery of the insulating layer.

6. The wiring board according to claim 1, wherein one of the line conductors which is disposed in one interlayer among the interlayers, has a pattern including a folded portion which faces a side face of the insulating substrate, and line widths of the folded portion and a portion of the line conductor which faces the side face of the insulating substrate are greater than line widths of the other portions of the line conductor.

7. The wiring board according to claim 3, wherein a granular insulating body enters at least a part of the line conductor in a thickness direction thereof.

8. The wiring board according to claim 7, wherein the insulating body is composed of a ceramic particle.

9. The wiring board according to claim 8, wherein the ceramic particles contain at least one selected from aluminum oxide, zirconium oxide, zirconium silicate, and magnesium oxide.

10. A temperature sensing element, comprising:
the wiring board according to claim 1; and
terminals electrically connected to the first end and the second end of the line conductor, respectively.

11. The wiring board according to claim 2, wherein the insulating substrate includes a plurality of insulating layers which are each composed of a ceramic sintered body and are stacked on one another, and the line conductor or the line conductors are composed of a thick film conductor.

12. The wiring board according to claim 11, wherein the ceramic sintered body is an aluminum-oxide based sintered body, and among the plurality of insulating layers, a lower insulating layer is an aluminum oxide sintered body of higher purity than a purity of the aluminum oxide sintered body of the uppermost insulating layer.

13. The wiring board according to claim 11, wherein a granular insulating body enters at least a part of the line conductor in a thickness direction thereof.

14. The wiring board according to claim 13, wherein the insulating body is composed of a ceramic particle.

15. The wiring board according to claim 14, wherein the ceramic particles contain at least one selected from aluminum oxide, zirconium oxide, zirconium silicate, and magnesium oxide.

16. A temperature sensing element, comprising:
the wiring board according to claim 2; and
terminals electrically connected to the first end and the second end of the line conductor, respectively.

17. A wiring board, comprising:
an insulating substrate composed of a stack of a plurality of insulating layers, the insulating substrate having an upper face, a lower face, and side faces; and
a line conductor formed of platinum or a metallic material comprising platinum as a main component, the line conductor including a first end and a second end located on a side opposite to the first end, the line conductor being disposed between the plurality of insulating layers in a pattern including at least one folded portion which faces a side face of the insulating substrate, line widths of the at least one folded portion and a portion of the line conductor which faces the side face of the insulating substrate being greater than line widths of the other portions of the line conductor, the insulating substrate including a plurality of insulating layers which are each composed of a ceramic sintered body and are stacked on one another, and the line conductor or the line conductors being composed of a thick film conductor.

18. The wiring board according to claim 17, wherein the line conductor has a meander-shaped pattern including a plurality of straight portions aligned in parallel to each other and a plurality of folded portions each connecting ends of adjacent straight portions among the plurality of straight portions, and within the meander-shaped pattern, line widths of a straight portion located on the outermost side and the plurality of folded portions are greater than line widths of the other straight portions, and the insulating layer has a quadrangular shape, and in the meander-shaped pattern, the straight portions and the folded portions are arranged in parallel to an outer periphery of the insulating layer.

19. The wiring board according to claim 17, wherein the ceramic sintered body is an aluminum-oxide based sintered body, and among the plurality of insulating layers, a lower insulating layer is an aluminum oxide sintered body of higher purity than a purity of the aluminum oxide sintered body of the uppermost insulating layer.

20. The wiring board according to claim 17, wherein a granular insulating body enters at least a part of the line conductor in a thickness direction thereof.

21. The wiring board according to claim 20, wherein the insulating body is composed of a ceramic particle.

22. The wiring board according to claim 21, wherein the ceramic particles contain at least one selected from aluminum oxide, zirconium oxide, zirconium silicate, and magnesium oxide.

23. A temperature sensing element, comprising:
the wiring board according to claim 17; and
terminals electrically connected to the first end and the second end of the line conductor, respectively.

* * * * *